United States Patent
Yamashita et al.

(10) Patent No.: US 7,755,062 B2
(45) Date of Patent: Jul. 13, 2010

(54) ION SOURCE AND ION IMPLANTATION APPARATUS

(75) Inventors: Takatoshi Yamashita, Kyoto (JP); Tadashi Ikejiri, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 0 days.

(21) Appl. No.: 12/391,919

(22) Filed: Feb. 24, 2009

(65) Prior Publication Data

US 2009/0212232 A1 Aug. 27, 2009

(30) Foreign Application Priority Data

Feb. 26, 2008 (JP) ............................. 2008-044581

(51) Int. Cl.
*H01J 27/02* (2006.01)
*H01J 49/10* (2006.01)
*H01J 49/14* (2006.01)

(52) U.S. Cl. ................. 250/423 R; 250/492.3; 250/396 R; 315/111.81; 315/111.21; 315/111.41; 313/310; 313/363.1

(58) Field of Classification Search ............. 250/423 R, 250/482.3; 315/111.81, 111.21, 111.41; 313/310, 363.1
See application file for complete search history.

(56) References Cited

U.S. PATENT DOCUMENTS

| 2009/0001290 A1* | 1/2009 | Yamashita ............... 250/492.3 |
| 2009/0078890 A1* | 3/2009 | Yamashita et al. ....... 250/492.3 |
| 2009/0114815 A1* | 5/2009 | Vanderberg et al. ......... 250/288 |
| 2010/0038556 A1* | 2/2010 | Miyamoto ............... 250/423 R |
| 2010/0051825 A1* | 3/2010 | Yamashita et al. ...... 250/423 R |

FOREIGN PATENT DOCUMENTS

JP 2002-334662 11/2002

* cited by examiner

*Primary Examiner*—Nikita Wells
(74) *Attorney, Agent, or Firm*—Osha • Liang LLP

(57) ABSTRACT

An ion source is to extract a ribbon-shaped ion beam longer in the Y direction in the Z direction and provided with a plasma generating chamber, a plasma electrode which is disposed near the end of the plasma generating chamber in the Z direction and has an ion extracting port extending in the Y direction, a plurality of cathodes for emitting electrons into the plasma generating chamber to generate a plasma and arranged in a plurality of stages along the Y direction, and a magnetic coil which generates magnetic fields along the Z direction in a domain containing the plurality of cathodes inside the plasma generating chamber.

7 Claims, 12 Drawing Sheets

ION SOURCE AND ION IMPLANTATION APPARATUS

TECHNICAL FIELD

The present disclosure relates to an ion source in which on the assumption that three directions substantially orthogonal at one point are an X direction, Y direction and Z direction, a ribbon-shaped (which may also be referred to as sheet-shaped or band-shaped, hereinafter the same will apply) ion beam having a dimension in the Y direction greater than that in the X direction is extracted in the Z direction. The present disclosure also relates to an ion implantation apparatus equipped with the ion source.

RELATED ART

FIG. 1 shows one example of a ribbon-shaped ion beam 2 in which a dimension $W_Y$ in the Y direction is greater than a dimension $W_X$ in the X direction.

Patent Document 1 has described a so-called Bernas-type ion source in which a filament and a reflecting electrode are opposed to each other between both ends of the longitudinal direction of an ion extracting slit inside a plasma generating chamber. Further, magnetic fields are applied in a direction along an axis which connects the filament and the reflecting electrode (specifically, a direction along the longitudinal direction of the ion extracting slit).

The longitudinal direction of the ion extracting slit of this ion source is given as the Y direction, by which the above-described ribbon-shaped ion beam having a greater dimension in the Y direction can be somehow extracted in the Z direction. In this case, the magnetic fields are applied inside the plasma generating chamber in a direction which is along the longitudinal direction of the ion extracting slit or, therefore, a direction along the Y direction.

[Patent Document 1] Japanese Published Unexamined Patent Application No. 2002-334662 (Paragraph 0002-0012, FIG. 12)

In the above-described ion source, in order to control a beam current density distribution of the ion beam in the Y direction which is extracted from the ion source (for example, increase in uniformity), it is effective to control a plasma density distribution in the Y direction inside the plasma generating chamber. However, in a related-art ion source, since magnetic fields are applied along the Y direction, even in an attempt to control a plasma density partially (locally), the partial control thereof easily influences all over a region in a direction along the magnetic fields, that is, all over a region in the Y direction, thus it is difficult to control the plasma density distribution in the Y direction. However, if application of the magnetic fields is stopped, containment of electrons by the magnetic fields will not be exerted, thus resulting in a decrease in plasma generation efficiency.

Further, since the magnetic fields along the Y direction spread to a part from which an ion beam is extracted from a plasma generating chamber (specifically, in the vicinity of an ion extracting slit), a problem is posed that on extraction of the ion beam, the ion beam receives Lorentz force in the X direction resulting from the magnetic fields, thereby an orbit of the ion beam is curved in the X direction. In order to correct the curved orbit, a mechanism for returning the curved ion beam is required, thereby the constitution and the control of the ion source is complicated.

SUMMARY

Exemplary embodiments of the present invention provide an ion source capable of easily controlling a plasma density distribution in the Y direction inside a plasma generating chamber and also prevent an orbit of an ion beam from being curved by magnetic fields generated inside the plasma generating chamber.

Further, exemplary embodiments of the present invention provide an ion implantation apparatus capable of making a beam current density distribution of a ribbon-shaped ion beam in the Y direction inside an implantation chamber closer to a predetermined distribution.

An ion source according to a first aspect of the present invention is an ion source which extracts, in a Z direction, a ribbon-shaped ion beam having a dimension in a Y direction greater than that in a X direction wherein the X direction, the Y direction and the Z direction are substantially orthogonal at one point, the ion source comprising:

a plasma generating chamber into which a material gas is introduced to generate plasma thereinside;

a plasma electrode which is disposed near the end of the plasma generating chamber in the Z direction and has an ion extracting port extending in the Y direction;

a plurality of cathodes which emits electrons into the plasma generating chamber to cause an electrical discharge inside the plasma generating chamber to ionize the material gas, thereby generating the plasma, the cathodes being disposed inside the plasma generating chamber on the side opposite to the plasma electrode, the cathodes being arranged in a plurality of stages along the Y direction; and a magnetic coil which is disposed outside the plasma generating chamber to generate magnetic fields along the Z direction inside the plasma generating chamber and also at a domain containing the plurality of cathodes.

In the ion source, since electrons emitted from a plurality of cathodes arranged in a plurality of stages along the Y direction are captured by magnetic fields along the Z direction and restricted from movement to the Y direction, movement of the electrons in the Y direction is decreased. Therefore, the electrons captured by the magnetic fields will influence the plasma generation at other parts in the Y direction to a smaller extent. Further, the plurality of cathodes arranged in a plurality of stages along the Y direction are provided to adjust a quantity of electrons emitted from the cathodes in each of the stages, thus making it possible to partially adjust the plasma generating action in each of the stages by these electrons. As a result, it is possible to easily control a plasma density distribution in the Y direction inside a plasma generating chamber.

Further, magnetic fields generated inside the plasma generating chamber are along the Z direction which is an ion beam extracting direction. Therefore, ions extracted from the plasma generating chamber are substantially not influenced by Lorentz force resulting from the magnetic fields. Thus, it is possible to prevent an orbit of the ion beam extracted from the ion source from being curved by the magnetic fields.

In the ion source according to a second aspect of the invention, the plasma electrode may be rendered to a negative potential more greatly than the cathodes, thereby also acting as a reflecting electrode which reflects electrons inside the plasma generating chamber.

In the ion source according to a third aspect of the invention, a rear reflecting electrode may further be provided behind the plurality of cathodes inside the plasma generating chamber and which is rendered to a negative potential more greatly than each of cathodes to reflect electrons inside the plasma generating chamber.

In the ion source according to a fourth aspect of the invention, the magnetic coil may be a single coil or made up of a plurality of coils which, with the Z direction given as an axis, are individually wound so as to enclose the plasma generating chamber and also disposed so as to be spaced away from each other along the Z direction, thereby generating magnetic fields which are mutually in the same direction.

In the ion source according to a fifth aspect of the invention, magnetic fields generated by a coil disposed on the side closest to the plasma electrode, among a plurality of coils constituting the magnetic coil, may be made stronger than magnetic fields generated by other coils.

An ion implantation apparatus according to a sixth aspect of the present invention is an ion implantation apparatus comprising:

the ion source;

a plurality of cathode power sources which heats each cathode of the ion source to emit electrons;

an implantation chamber which makes the ion beam generated from the ion source incident into a target;

a beam measuring instrument which measures a beam current density distribution of the ion beam in the Y direction inside the implantation chamber; and a controller which is formed to control the cathode power sources on the basis of measurement information from the beam measuring instrument and also control a quantity of electrons emitted from each of the cathodes, so that the beam current density distribution measured by the beam measuring instrument is made closer to a predetermined distribution.

In the ion implantation apparatus according to a seventh aspect of the present invention, the above-described controller may have a control function to perform at least one of the actions for decreasing a quantity of electrons emitted from the cathode corresponding to a domain relatively great in beam current density measured by the beam measuring instrument and increasing a quantity of electrons emitted from the cathode corresponding to a domain relatively small in beam current density, thereby making the beam current density distribution measured by the beam measuring instrument close to uniform.

According to the first aspect of the invention, since electrons emitted from a plurality of cathodes arranged in a plurality of stages along the Y direction are captured by magnetic fields along the Z direction and restricted from movement in the Y direction, movement of the electrons in the Y direction is decreased. Therefore, the electrons captured by the magnetic fields will influence the plasma generation at other parts in the Y direction to a smaller extent. Further, the plurality of cathodes arranged in a plurality of stages along the Y direction are provided to adjust a quantity of electrons emitted from cathodes in each of the stages, thus making it possible to partially adjust the plasma generation action in each of the stages by these electrons. As a result, it is possible to easily control a plasma density distribution in the Y direction inside a plasma generating chamber.

As a result, it is possible to easily adjust a beam current density distribution of the ribbon-shaped ion beam extracted from the ion source in the Y direction. For example, the beam current density distribution of the ion beam in the Y direction can be improved in uniformity or a predetermined beam current density distribution can be easily realized.

Further, magnetic fields generated inside the plasma generating chamber are along the Z direction, which is an ion beam extracting direction. Therefore, ions extracted from the plasma generating chamber are substantially not influenced by Lorentz force resulting from the magnetic fields. Thus, it is possible to prevent an orbit of the ion beam extracted from the ion source from being curved by the magnetic fields. As a result, no additional mechanism for correcting the curved orbit of the ion beam is required.

According to the second aspect of the invention, the following additional effect can be obtained.

Specifically, the plasma electrode also acts as a reflecting electrode, and the plasma electrode is able to reflect electrons inside the plasma generating chamber to cathodes. Therefore, ionization efficiency of a material gas by electrons can be increased to enhance plasma generation efficiency. It is also possible to extract an ion beam in greater current.

Further, the plasma electrode which also acts as a reflecting electrode functions not only to reflect electrons but also attract ions inverse in polarity to electrons in plasma (specifically, positive ions, hereinafter the same will apply.) and draw them out through an ion extracting port. Still further, as described above, magnetic fields are along the Z direction and will not prevent electrons or ions from moving in the Z direction, thus making it possible to efficiently extract an ion beam.

According to the third aspect of the invention, the following additional effect can be obtained. Specifically, the above-described rear reflecting electrode is also provided and the rear reflecting electrode can be used to reflect electrons efficiently on the cathodes as well. It is, therefore, possible to reflect electrons inside a plasma generating chamber repeatedly and efficiently between the plasma electrode acting as a reflecting electrode and the rear reflecting electrode. As a result, ionization efficiency of a material gas by electrons can be further increased to enhance plasma generation efficiency. It is also possible to extract an ion beam in greater current.

According to the fourth aspect of the invention, the following additional effect can be obtained.

Specifically, since the magnetic coil is, as described above, made up of a plurality of coils, magnetic fields can be dispersed to a smaller extent inside a plasma generating chamber to generate inside the plasma generating chamber more parallel magnetic fields in the Z direction. Thus, it is possible to exert the above-described working effect by the magnetic fields more effectively.

Further, where a single coil longer in the Z direction is disposed as a magnetic coil so as to enclose the plasma generating chamber, an access to the plasma generating chamber is restricted by the coil. However, in the present invention, a plurality of coils are disposed so as to be spaced away from each other in the Z direction. Thus, through a clearance between these coils, a relatively easy access to the plasma generating chamber can be obtained. Therefore, for example, it is possible to easily attach a current feedthrough and others to a plasma generating chamber, install a wiring and maintain the plasma generating chamber.

According to the fifth aspect of the invention, the following additional effect can be obtained. Specifically, magnetic fields generated by a coil disposed on the side closest to the plasma electrode are rendered as described above, by which magnetic fields near a plasma electrode ion extracting port can be made stronger than others to increase a plasma density. Thus, it is possible to increase the plasma density near the ion extracting port. As a result, it is possible to extract a greater current ion beam efficiently.

According to the sixth aspect of the invention, the following additional effect can be obtained, besides the above-described effects of the ion source.

Specifically, since a controller is provided having a control function of controlling cathode power sources on the basis of measurement information from the beam measuring instrument and also controlling a quantity of electrons emitted from the cathodes, thereby making a beam current density distribution measured by the beam measuring instrument closer to a predetermined distribution. Therefore, it is possible to make the beam current density distribution of the ribbon-shaped ion beam inside an implantation chamber in the Y direction closer to a predetermined distribution.

According to the seventh aspect of the invention, the following additional effect can be obtained. Specifically, since the controller is provided with the above-described control functions, the beam current density distribution of the ribbon-shaped ion beam inside the implantation chamber in the Y direction is made close to uniform, thus making it possible to improve the uniformity of the beam current density distribution.

Other features and advantages may be apparent from the following detailed description, the accompanying drawings and the claims.

DETAILED DESCRIPTION (1) Ion Source

Figure 2:
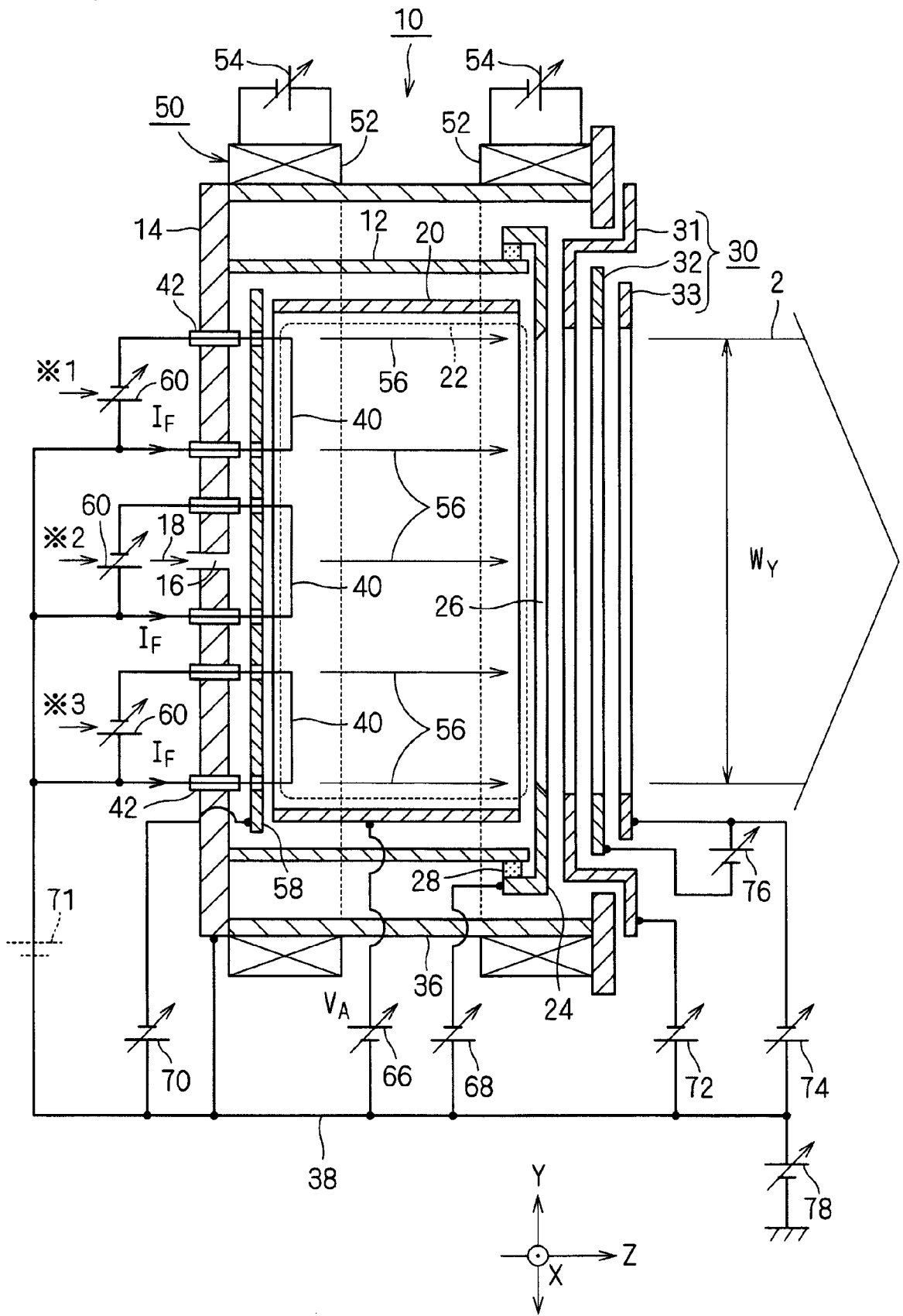
FIG. 2 is a longitudinal sectional view showing one embodiment of the ion source of the present invention, together with a power source.
Figure 3:
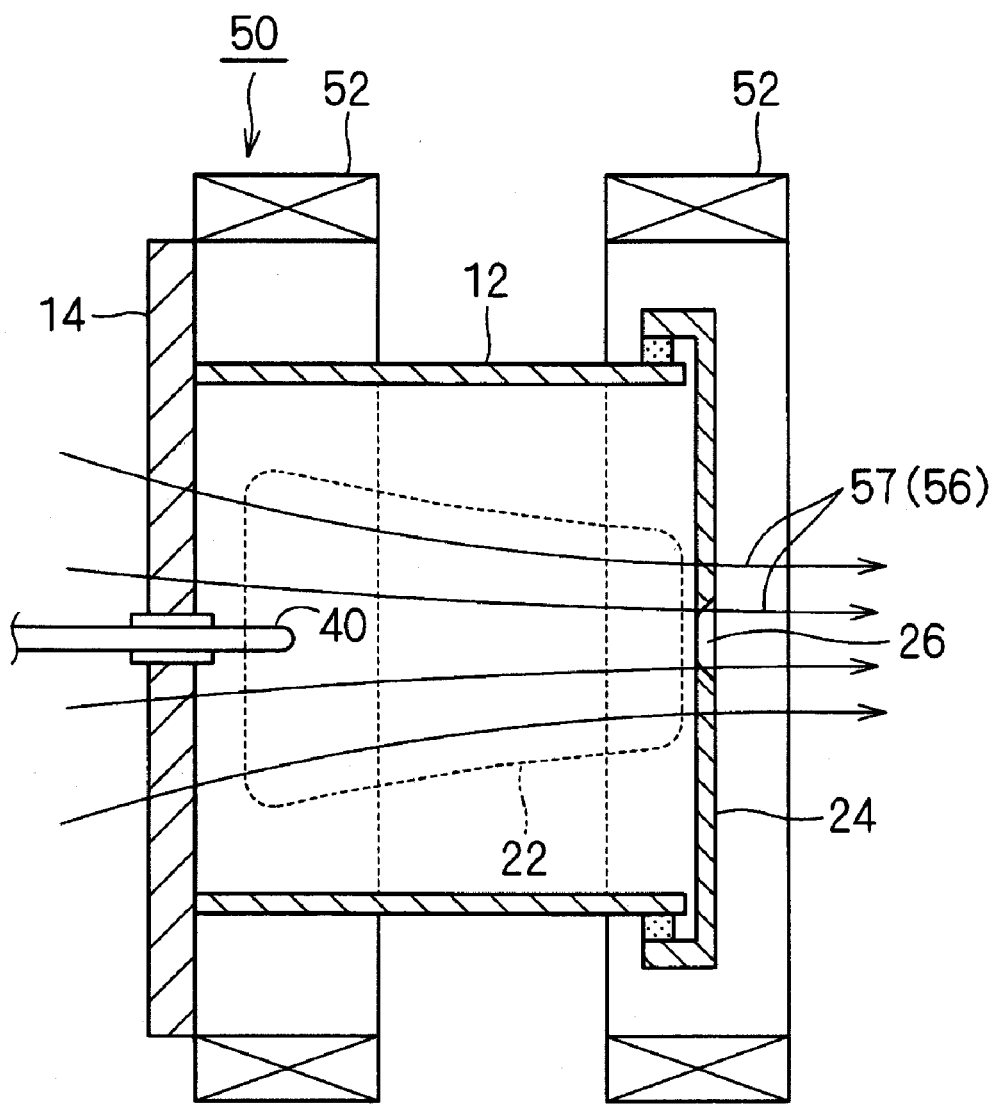
FIG. 3 is a transverse sectional view schematically showing the periphery of a plasma generating chamber of the ion source shown in FIG. 2.
Figure 3:
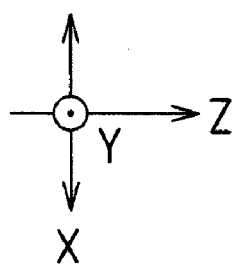

FIG. 2 is a longitudinal sectional view showing one embodiment of the ion source of the present invention, together with a power source. FIG. 3 is a transverse sectional view showing briefly the periphery of a plasma generating chamber of the ion source shown in FIG. 2, and constituents not used in the description are omitted.

Figure 1:
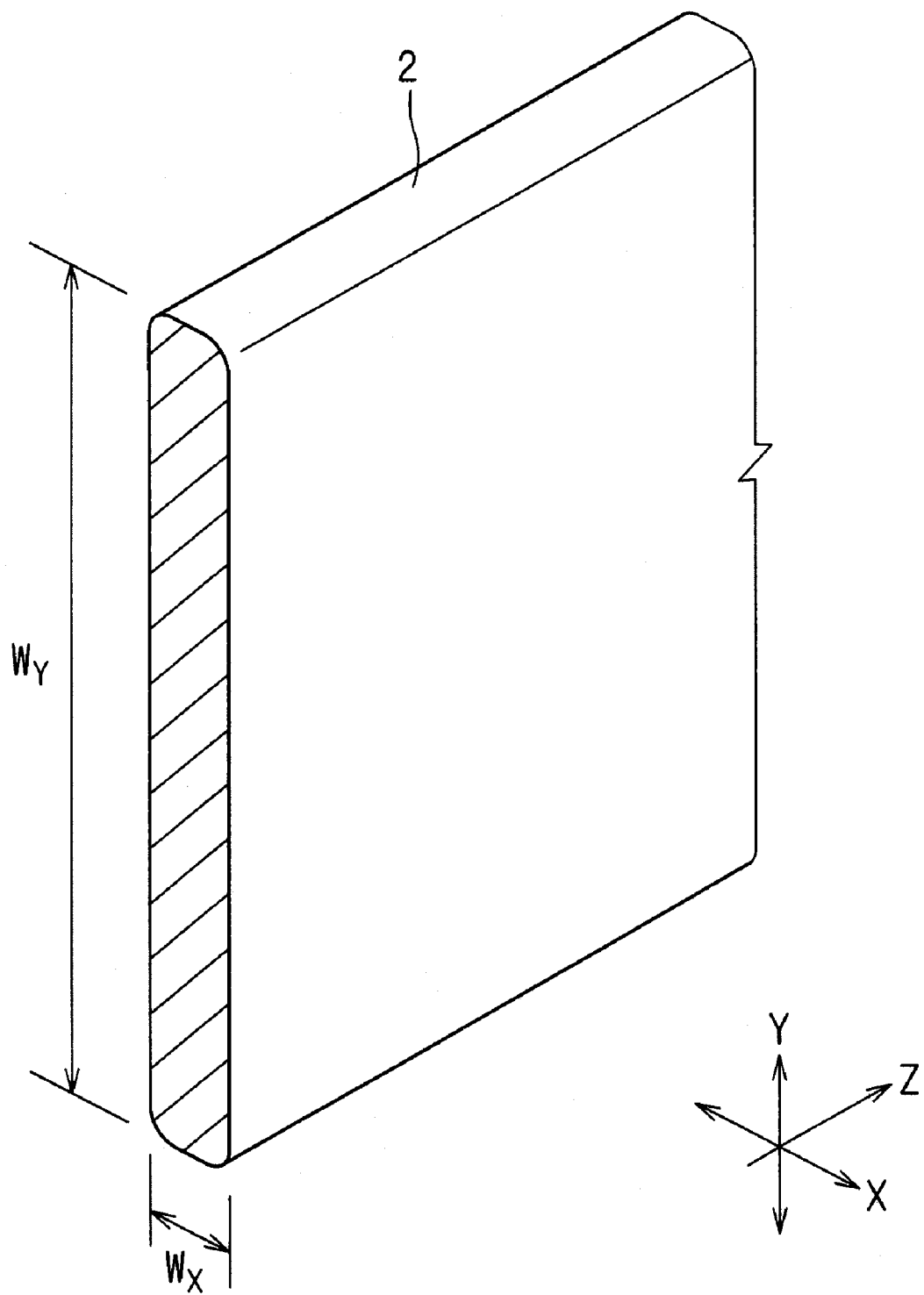
FIG. 1 is a schematic perspective view showing one example of a ribbon-shaped ion beam.

On the assumption that the three directions substantially orthogonal at one point are given as an X direction, Y direction and Z direction, for example, as shown in FIG. 1, an ion source 10 is an ion source which extracts a ribbon-shaped ion beam 2 having a dimension $W_Y$ in the Y direction greater than a dimension $W_X$ in the X direction in the Z direction.

A description of the ribbon-shaped does not mean a thin ribbon made of paper or cloth. For example, the dimension $W_X$ of the ion beam 2 in the X direction is about 5 cm to 10 cm, while the dimension $W_Y$ thereof in the Y direction is about 35 cm to 50 cm. However, the present invention shall not be limited to these dimensions.

The ion source 10 is provided with a plasma generating chamber 12 for generating plasma 22 inside the chamber. The plasma generating chamber 12, a plasma electrode 24 to be described later and others are accommodated inside a vacuum chamber 36 (which is also called an ion source chamber) in this embodiment.

The plasma generating chamber 12 is formed in a rectangular solid shape which is opened at the end in the Z direction (specifically an ion beam extracting direction). In this embodiment, a rear face plate 14 which constitutes a wall face opposite to the Z direction of the plasma generating chamber 12 also acts as a rear face plate of the vacuum chamber 36. However, the rear face plate of the vacuum chamber 36 may separately be formed from the rear face plate 14 of the plasma generating chamber 12.

In this embodiment, the plasma generating chamber 12, the rear face plate 14 and the vacuum chamber 36 are electrically connected to each other and at the same potential. This potential part forms one reference potential part, which is referred to as a yellow potential part 38.

Inside the plasma generating chamber 12, for example, a desired material gas 18 (including the case of steam) which is a raw material for forming the plasma 22 is introduced from a gas introduction port 16.

The plasma generating chamber 12 may also act as an anode with respect to a cathode 40 to be described later, alternatively, as described in this embodiment, may have an anode 20 thereinside. The anode 20 is formed, for example, in a rectangular tubular shape and electrically insulated from the plasma generating chamber 12.

Between the anode 20 and the yellow potential part 38 (that is, cathodes 40), a direct-current arc power source 66 is connected, with the anode 20 given to the positive electrode. The direct-current arc power source 66 accelerates thermal electrons emitted from the cathodes 40 to ionize the material gas 18 introduced into the plasma generating chamber 12 and also causes an arc discharge inside the plasma generating chamber 12 to generate the plasma 22. Where the plasma generating chamber 12 also acts as an anode, the positive electrode of the arc power source 66 is connected to the plasma generating chamber 12.

In place of a case where the arc power source 66 is commonly connected to a plurality of cathodes 40 as described in this embodiment, the arc power source 66 may be provided individually on the respective cathodes 40, that is, they may be provided individually between respective cathodes 40 and the anode 20 (or the plasma generating chamber 12). When individually provided, as will be described later, each of the arc power sources 66 is controlled for an output voltage $V_A$, thus making it possible to control a plasma density distribution inside the plasma generating chamber 12.

In the Z direction of the plasma generating chamber 12, that is, near the end of the plasma generating chamber 12 in the Z direction, the plasma electrode 24 having an ion extracting port 26 extending in the Y direction is provided. The plasma electrode 24 in principle acts to extract ions in the Z direction from the plasma 22 generated inside the plasma generating chamber 12 through the ion extracting port 26. The ion extracting port 26 may be, as shown in this embodiment, a slit longer in the Y direction or a plurality of holes arrayed in the Y direction.

In this embodiment, the plasma electrode 24 is electrically insulated from the plasma generating chamber 12 by an insulator 28, and a negative voltage is applied from a direct-current first power source 68, with the yellow potential part 38 given as a reference. As will be described later, since one end of respective cathodes 40 is connected to the yellow potential part 38, the first reflection power source 68 renders the plasma electrode 24 to a negative potential more greatly than the cathodes 40. Therefore, in this embodiment, the plasma electrode 24 also acts as a reflecting electrode which reflects (repels) electrons (mainly thermal electrons from the cathode 40) inside the plasma generating chamber 12.

Near the Z direction of the plasma electrode 24, provided is an extracting electrode system 30 which extracts the ion beam 2 in collaboration with the plasma electrode 24 due to the actions of electric fields from the plasma 22 inside the plasma generating chamber 12. In this embodiment, the extracting electrode system 30 is provided with an extracting electrode 31, a suppressor electrode 32 and a ground electrode 33. These electrodes 31, 32, and 33 are respectively provided with an ion extracting port corresponding to the ion extracting port 26 of the plasma electrode 24.

For the purpose of extracting the ion beam 2, a negative voltage from a direct-current first extracting power source 72 with reference to the yellow potential part 38 is applied to the extracting electrode 31. The output voltage of the first extracting power source 72 makes it possible to control a quantity that ion beam 2 is extracted. A negative voltage from a direct-current second power source 74 with reference to the yellow potential part 38 is applied to the ground electrode 33. The ground electrode 33 is not provided at an earth potential but is usually called in this way. The output voltage of the second extracting power source 74 makes it possible to fix energy of the ion beam 2 extracted from the ion source 10. For the purpose of suppressing back-flow electrons from downstream, a negative voltage from a direct-current suppressor power source 76 with reference to a potential of the ground electrode 33 is applied to the suppressor electrode 32.

A positive voltage (acceleration voltage) from a direct-current acceleration power source 78 with reference to the earth potential is applied to the yellow potential part 38. Energy of the ion beam 2 made incident into a target 82 (refer to FIG. 10) at the earth potential is fixed by the output voltage of the acceleration power source 78.

However, the above-described constitution of the extracting electrode system 30 and that of the power source for the same are just one example, to which the present invention shall not be limited.

Figure 4:
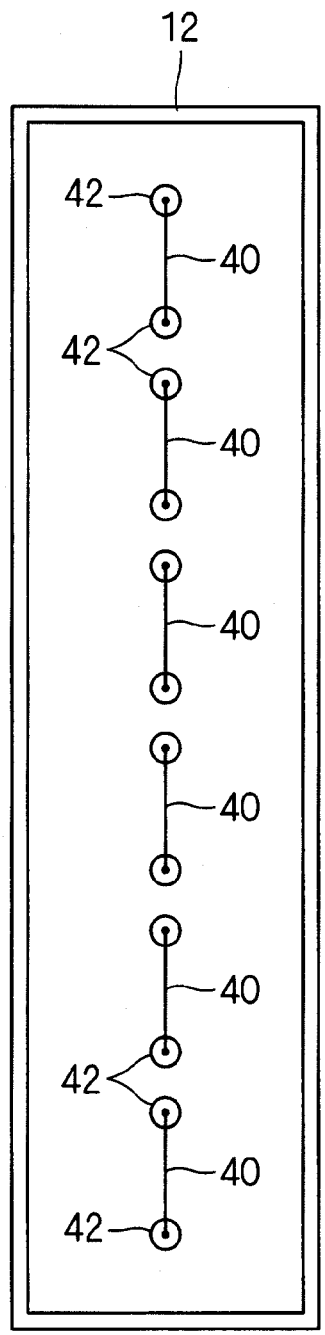
FIG. 4 is a front elevational view showing one example of an arrangement of a plurality of filaments.
Figure 4:
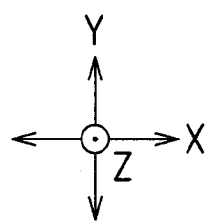
Figure 5:
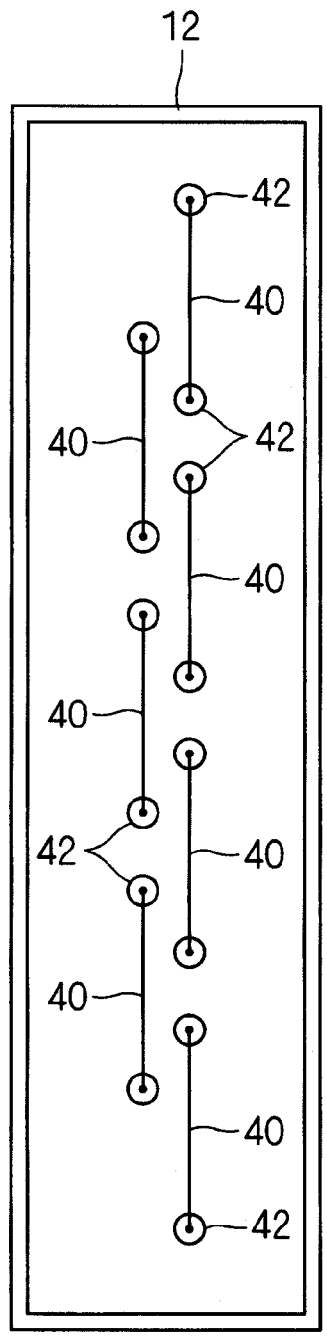
FIG. 5 is a front elevational view showing another example of an arrangement of a plurality of filaments.
Figure 5:
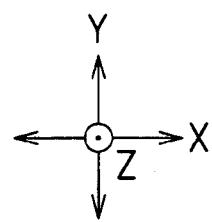
Figure 6:
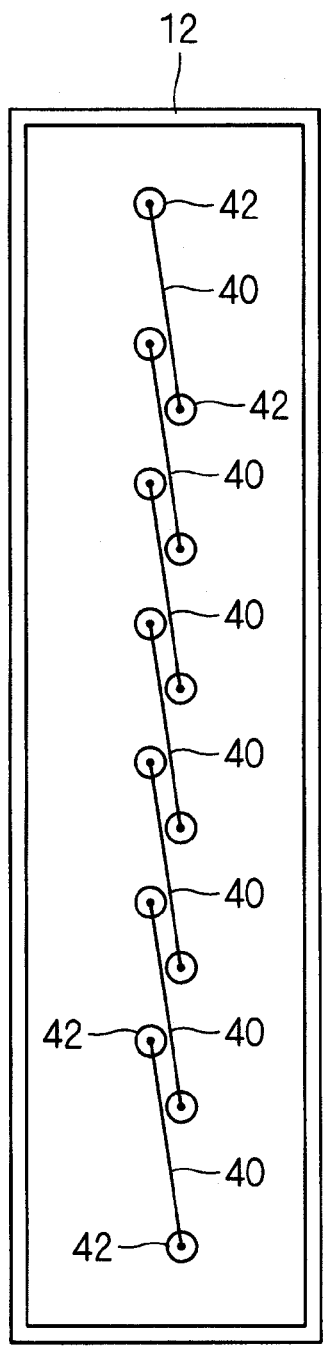
FIG. 6 is a front elevational view showing still another example of an arrangement of a plurality of filaments.
Figure 6:
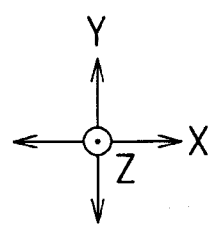

On the side opposite to the plasma electrode 24 inside the plasma generating chamber 12, the plurality of cathodes 40 are arranged in a plurality of stages along the Y direction so as to oppose the plasma electrode 24. The plurality of cathodes 40 emit electrons (thermal electrons) in the plasma generating chamber 12, causing an electrical discharge to ionize a material gas 18 in the plasma generating chamber 12 to generate the plasma 22. In the example shown in FIG. 2, the number of the cathodes 40 is simplified into three, to which the present invention shall not be, however, limited (for example, as shown in FIG. 4 to FIG. 6 to be described later, about seven cathodes maybe used). In this embodiment, each of the cathodes 40 is a direct heating-type cathode, that is, a filament.

In this embodiment, each of the cathodes 40 is formed in a rod shape (or a linear shape) and in a U-letter shape when viewed horizontally (from the X direction) and arranged in a plurality of stages along the Y direction.

A cathode power source 60 for heating these cathodes to emit electrons via a current feedthrough 42 is connected to each of the cathodes 40. Each of the cathode power sources 60 may be, as shown in the drawing, a direct-current power source or an alternating-current power source. Each of the cathode power sources 60 controls (increase/decrease) individually a current $I_F$ flowing into each of the cathodes 40, for example, by a controller 90 to be described later (refer to FIG. 10). It is, thereby, possible to control a quantity of electrons emitted from each of the cathodes 40.

As described above, in this embodiment, one end of each of the cathodes 40 is connected to the yellow potential part 38. Since an output voltage of respective cathode power sources 60 is usually low (for example, about 5V), each of the cathodes 40 is substantially rendered into a potential of the yellow potential part 38.

A magnetic coil 50 is provided outside the plasma generating chamber 12. The magnetic coil 50 generates magnetic fields 56 along the Z direction and in a domain containing the plurality of cathodes 40 inside the plasma generating chamber 12. More specifically, in this embodiment, the magnetic coil 50 is disposed (wound) at an outer periphery of the vacuum chamber 36.

Constituents near the magnetic coil 50, for example, the vacuum chamber 36, the plasma generating chamber 12, the rear face plate 14, the anode 20, the plasma electrode 24, the extracting electrode system 30 and a rear reflecting electrode 58 to be described later are made of nonmagnetic materials so as not to disturb the magnetic fields 56.

The magnetic coil 50, which may be a single tubular coil, in this embodiment is made up of a plurality of coils 52 (two coils in this embodiment). Each of the coils 52 is a tubular (or annular) coil wound so as to enclose the plasma generating chamber 12, with the Z direction given as an axis. Each of the coils 52 is disposed so as to be spaced away from each other along the Z direction. More specifically, one of the coils 52 encloses the vicinity of the front end (end of the plasma generating chamber 12 in the Z direction), while the other coil 52 encloses the vicinity of the rear end of the plasma generating chamber 12. Each of the coils 52 generates magnetic fields which face each other in the same direction. The plurality of coils 52 work together to generate the above-described magnetic fields 56.

Each of the coils 52 may be connected to each other in series, thereby allowing an excitation current to flow from a single coil power source. However, in this embodiment, a plurality of direct-current coil power sources 54 are used to excite individually each of the coils 52. Thereby, it is possible to easily change the intensity of magnetic fields generated by each of the coils 52.

Behind the plurality of cathodes 40 inside the plasma generating chamber 12, as with this embodiment, the rear reflecting electrode 58 may be provided. The reflecting electrode 58 is large enough to cover the back of the plurality of cathodes 40. More specifically, it is large enough to cover substantially a whole part of the back face inside the plasma generating chamber 12.

The rear reflecting electrode 58 is electrically insulated from the plasma generating chamber 12 and the rear face plate 14. It is also electrically insulated from the respective cathodes 40 and the anode 20. As described in this embodiment, the rear reflecting electrode 58 may apply a negative voltage from the direct-current second power source 70 with reference to the yellow potential part 38, alternatively not electrically connected anywhere but rendered into a floating potential. This is because even when rendered into the floating potential, electrons emitted mainly from the cathodes 40 and high in energy corresponding to an output voltage of the arc power source 66 are made incident, by which the rear reflecting electrode 58 is charged at a negative potential. As described above, the rear reflecting electrode 58 can be rendered into a negative potential more greatly than the respective cathodes 40. Therefore, the rear reflecting electrode 58 acts to reflect (repel) electrons (thermal electrons mainly from the cathodes 40) inside the plasma generating chamber 12.

In the ion source 10, since electrons emitted from a plurality of cathodes 40 arranged in a plurality of stages along the Y direction are captured by magnetic fields 56 along the Z direction and restricted from movement in the Y direction, movement of the electrons move in the Y direction is decreased. This is because electrons perform a turning motion (Larmor rotation) to wind around the magnetic fields 56 and the electrons are able to move in a direction along the magnetic fields 56 (that is, the Z direction) but it is difficult to move in a direction of traverse to the magnetic fields 56 (that is, the Y direction). The orbit of electrons has been simulated to confirm that the electrons gather individually near the Y coordinate of the respective cathodes 40 mainly, and form groups the number of which is equal to the number of stages of the cathodes 40. Therefore, the electrons captured by the magnetic fields 56 along the Z direction will influence the plasma generation at other parts in the Y direction to a lesser extent. In other words, influences of each of the cathode 40 on plasma density are limited to the vicinity of the Y coordinate of the respective cathodes 40.

Further, the plurality of cathodes 40 are provided, arranged in a plurality of stages along the Y direction and are able to adjust a quantity of electrons emitted from each stage of the cathodes 40, thus making it possible to partially adjust the plasma generation action of each stage by these electrons. For example, when a quantity of electrons emitted from a certain cathode 40 is increased, there is a higher probability that the electrons collide with gas molecules, thus resulting in a greater plasma density near the Y coordinate of the cathode. On the other hand, when a quantity of electrons emitted from the cathode 40 is decreased, there is a lower probability that the electrons collide with gas molecules, thus resulting in a lower plasma density near the Y coordinate of the cathode 40.

As described above, according to this ion source 10, the magnetic fields 56 along the Z direction can be used to limit influences of the respective cathodes 40 on the plasma density to the vicinity of the Y coordinate of the respective cathodes 40. Further, a quantity of electrons emitted from the respective cathodes 40 is adjusted, thus making it possible to adjust the plasma density of each stage. Therefore, it is possible to easily control a plasma density distribution in the Y direction inside the plasma generating chamber 12.

As a result, it is possible to easily adjust a beam current density distribution of the ribbon-shaped ion beam 2 extracted from the ion source 10 in the Y direction. For example, it is possible to easily improve the uniformity of the beam current density distribution in the Y direction of the ion beam 2 and realize a predetermined beam current density distribution.

Further, since the magnetic fields 56 generated in the plasma generating chamber 12 are along the Z direction which is a direction that the ion beam 2 is extracted, Lorentz force resulting from the magnetic fields 56 will hardly act on ions extracted from the plasma generating chamber 12. Therefore, it is possible to prevent an orbit of the ion beam 2 extracted from the ion source 10 from being curved by the magnetic fields. As a result, no additional mechanism for correcting the curved orbit of the ion beam is required.

Still further, in the ion source 10 of this embodiment, as described above, the plasma electrode 24 also acts as a reflecting electrode, thus making it possible to reflect electrons inside the plasma generating chamber 12 to the cathodes 40 by using this plasma electrode 24. A probability that the electrons collide with a material gas 18 can be increased to raise the ionization efficiency of the material gas 18 by the electrons. Without the rear reflecting electrode 58 provided, the electrons will conduct a reciprocating motion between the respective cathodes 40 and the plasma electrode 24 which also acts as the reflecting electrode. Thereby, the probability that the electrons collide with the material gas 18 is increased, thus making it possible to raise the generating efficiency of the plasma 22. It is also possible to extract the ion beam 2 in greater current.

In addition, the plasma electrode 24 which also acts as a reflecting electrode functions to reflect electrons and also functions to attract ions (positive ions) reverse in polarity to electrons inside the plasma 22 and extract them through the ion extracting port 26. Further, as described above, the magnetic fields 56 are along the Z direction and do not prevent the movement of electrons or ions in the Z direction, thus making it possible to efficiently extract the ion beam 2. Specifically, ions inside the plasma 22 are first extracted by electric fields of the plasma electrode 24 through the ion extracting port 26 and then extracted as they are as the ion beam 2 by electric fields of the extracting electrode system 30.

It is noted that the insulator 28 and the first reflection power source 68 may be not provided but the plasma electrode 24 may be attached to the end of the plasma generating chamber 12 in the Z direction, thereby making the plasma electrode 24 and the plasma generating chamber 12 at the same potential. The plasma electrode 24 may form a wall face at the end of the plasma generating chamber 12 in the Z direction. In this case, when a circuit is constituted as shown in the drawing, the plasma electrode 24 and the respective cathodes 40 are made substantially at the same potential, thereby the plasma electrode 24 fails in exerting the above-described action of reflecting electrons.

When the plasma electrode 24 is constituted as described above, for example, in place of the first reflection power source 68, as shown by the broken line in FIG. 2, a direct-current bias power source 71 may be provided to apply a positive voltage from the bias power source 71 to the respective cathodes 40 with reference to the yellow potential part 38. If so constituted, the plasma electrode 24 is rendered to a negative potential more greatly than the respective cathodes 40, by which the plasma electrode 24 also acts as a reflecting electrode which reflects electrons inside the plasma generating chamber 12 to the cathodes 40.

Further, in the ion source 10 of this embodiment, the rear reflecting electrode 58 is provided, by which even on the cathodes 40, the rear reflecting electrode 58 can be used to efficiently reflect electrons. Therefore, it is possible to reflect electrons inside the plasma generating chamber 12 repeatedly and efficiently between the plasma electrode 24 which also acts as a reflecting electrode and the rear reflecting electrode 58. As a result, a probability that the electrons collide with the material gas 18 can be further increased to raise an ionization efficiency of the material gas 18 by the electrons. Thereby, it is possible to further increase the plasma generation efficiency and accordingly extract of the ion beam 2 of a greater current.

Still further, in the ion source 10 of this embodiment, as described above, since the magnetic coil 50 is made up of a plurality of coils 52, it is possible to decrease a dispersion of magnetic fields 56 inside the plasma generating chamber 12 and generate the magnetic fields 56 more parallel to the Z direction inside the plasma generating chamber 12. Therefore, it is possible to exert more effectively the above-described working effect by the magnetic fields 56.

In addition, where as the magnetic coil 50, for example, as shown in FIG. 2, the two coils 52 longer in the Z direction and one coil having a length corresponding to a distance between them are disposed so as to enclose the plasma generating chamber 12, is restricted by these coils an access to the plasma generating chamber 12. However, in the ion source 10, the plurality of coils 52 are disposed so as to be spaced away in the Z direction, thereby through a clearance between these coils 52, a relatively easy access to the plasma generating chamber 12 can be obtained. Therefore, for example, it is possible to easily attach a current feedthrough and others to the plasma generating chamber 12, install a wiring and maintain the plasma generating chamber 12.

In this embodiment, the coils 52 which constitute the magnetic coil 50 are two. However, the number of the coils may be increased, whenever necessary. In this case, for example, coil power sources 54 may be disposed accordingly.

Magnetic fields generated by a coil 52 which is disposed on the side closest to the plasma electrode 24 (in this embodiment, of two coils 52, the coil 52 on the side of the plasma electrode 24) of the above-described plurality of coils 52 may be greater than magnetic fields generated by the other coil 52. If so disposed, for example, an excitation current flowing from the coil power source 54 to the coil 52 disposed on the side closest to the plasma electrode 24 may be greater. Alternatively, the coil 52 disposed on the side closest to the plasma electrode 24 may be increased in the number of windings. The above two constitutions may be used in combination.

When the coil is disposed as described above, it is possible to make greater magnetic fields 56 near an ion extracting port 26 of the plasma electrode 24 than others. FIG. 3 shows a brief example thereof. Magnetic lines of force 57 concentrate near the plasma electrode 24 to make greater the magnetic fields 56 near the ion extracting port 26. Accordingly, an electron density inside the plasma generating chamber 12 is also increased near the ion extracting port 26. This fact has also been confirmed by the simulation of an orbit of electrons. Where the electron density is increased, there is a higher probability that electrons collide with a material gas 18 and a plasma density is also increased. Therefore, it is possible to make a density of the plasma 22 near the ion extracting port 26 higher than others. FIG. 3 shows schematically the plasma 22. As a result, it is possible to extract the ion beam in a greater current more efficiently.

Examples of filaments arranged in place of the cathodes 40 are shown respectively in FIG. 4 to FIG. 6.

The example shown in FIG. 4 is the same arrangement as that described in FIG. 2 (however, the number of filaments 40 is given in the number of the filaments which is closer to the number actually used, and this is also the same in FIG. 5 and FIG. 6). A plurality of longitudinally long filaments 40 are arrayed in a single line in the Y direction. Between the respective filaments 40, a clearance is provided. This example can also be used in a case where a partitioning plate 80 to be described later is provided.

The example shown in FIG. 5 is an arrangement in which a plurality of longitudinally long filaments 40 are arrayed in two lines and the respective filaments 40 are arranged so as to be overlapped slightly with each other in the Y direction. In this example, a state similar to that where the plurality of filaments 40 are arrayed in the Y direction without any breaks is provided. Thus, it is possible to prevent a domain lower in plasma density from generating due to the presence of the breaks.

The example shown in FIG. 6 is an arrangement in which a plurality of longitudinally long filaments 40 inclined diagonally at a predetermined angle to the Y direction are arranged so as to be overlapped slightly in the Y direction. In this example as well, since a state similar to that where the plurality of filaments 40 are arrayed in the Y direction without any breaks is provided, it is possible to prevent a domain lower in plasma density from generating due to the presence of the breaks.

It has been experimentally confirmed that in order to improve the uniformity of a beam current density distribution of the ion beam 2 in the Y direction and also increase beam current, the example of FIG. 5 is more effective than the example of FIG. 4 and the example of FIG. 6 is more effective than the example of FIG. 5. This may be probably due to the fact that the example of FIG. 6 is substantially similar to a case where the plurality of filaments 40 are arrayed in a single line in the Y direction without any breaks so as to oppose the ion extracting port 28 of the plasma electrode 24, thereby increasing a plasma density near the ion extracting port 26 and also improving the uniformity in the Y direction thereof.

Figure 7:
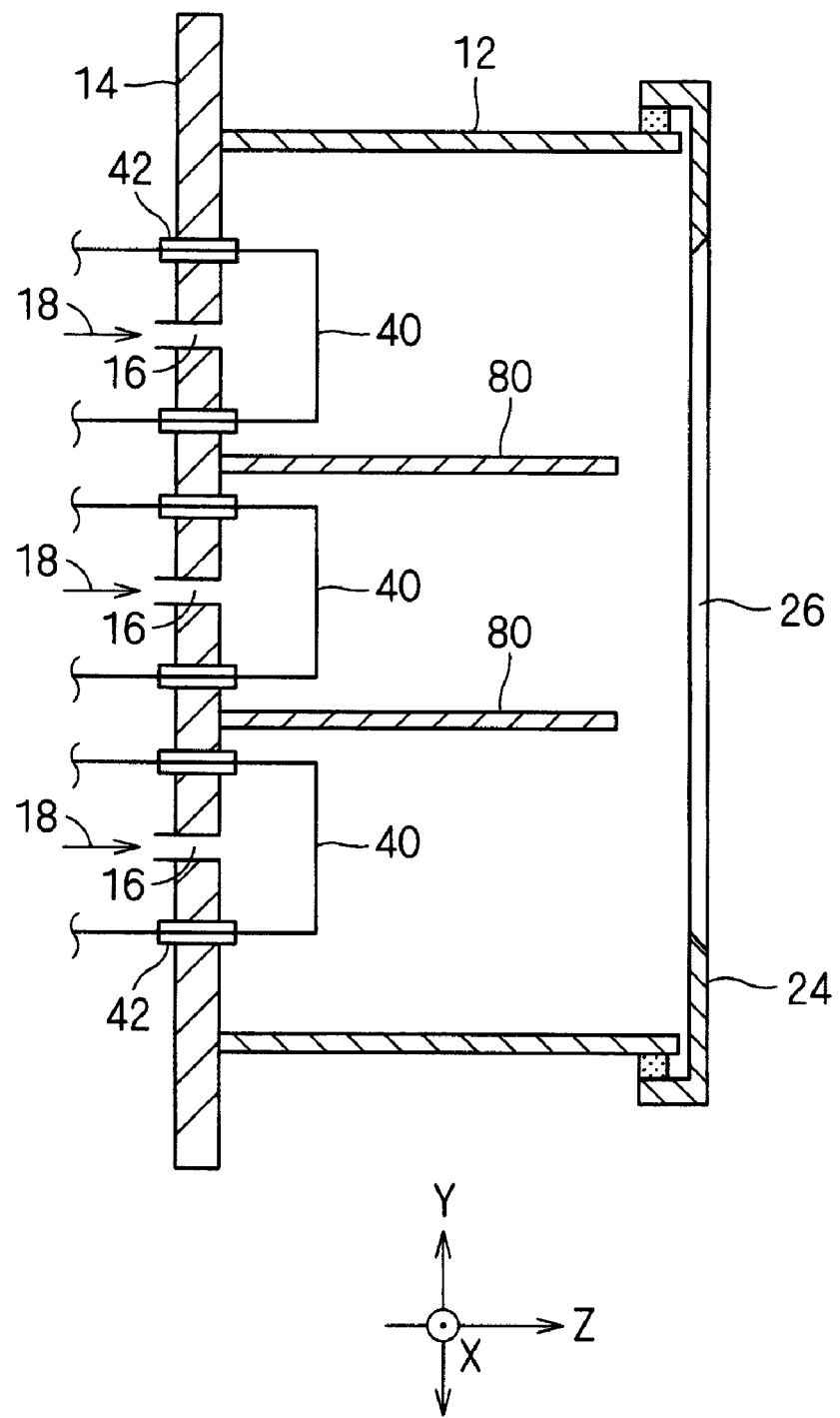
FIG. 7 is a drawing showing an example in which partitioning plates are provided inside the plasma generating chamber.
Figure 8:
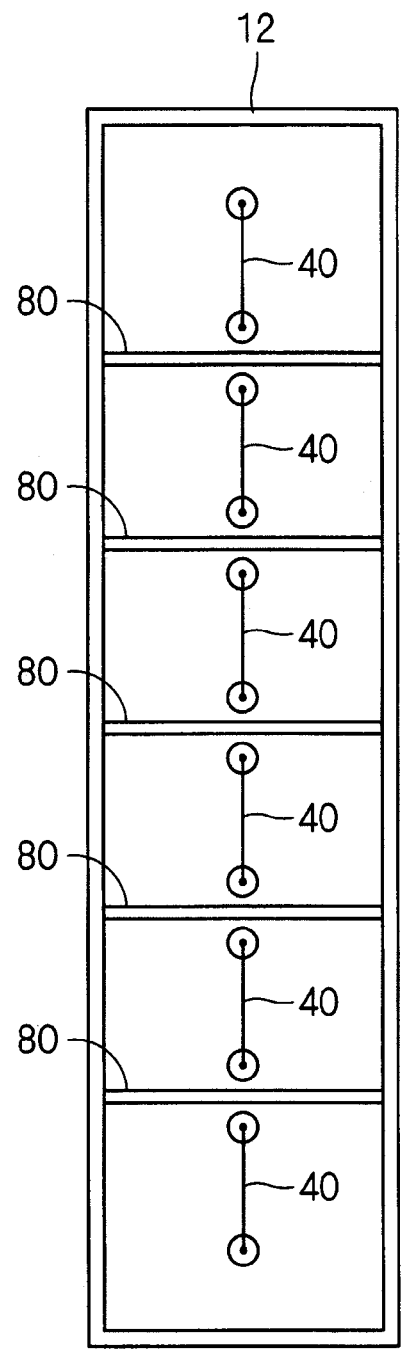
FIG. 8 is a front elevational view showing an example of an arrangement of the partitioning plate similar to that shown in FIG. 7.
Figure 8:
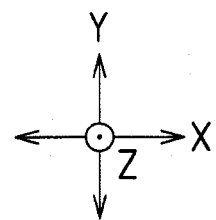

As shown in the example of FIG. 7, inside the plasma generating chamber 12, a partitioning plate 80 which divides a space between adjacent two cathodes 40 may be provided. A front elevational view showing an arrangement of the partitioning plate 80 is shown in FIG. 8 which corresponds to FIG. 4.

Since each of the partitioning plates 80 is exposed to a high temperature, it is preferably made of a heat resistant material such as molybdenum or carbon. The length of each of the partitioning plate 80 in the Z direction is not necessarily limited to that shown in FIG. 7 and may be appropriately determined in view of the relationship with the control of a necessary plasma density and others.

Since the above-described partitioning plates 80 are provided to prevent electrons emitted from the respective cathodes 40 from intruding into other partitions divided by the partitioning plates 80 and also prevent the plasma generated inside the respective partitions from diffusing into other partitions, it is possible to greatly improve the control performance of plasma density for each of the partitions by the respective cathodes 40. In controlling the plasma density, the above-described constitution may be used in combination. Thereby, it is possible to control more easily a plasma density distribution inside the plasma generating chamber 12 in the Y direction.

Further, for example, as shown in the example of FIG. 7, a gas introduction port 16 may be provided in the respective partitions divided by the partitioning plates 80, thereby introducing a material gas 18 into the respective partitions independently. In this case, provided are a plurality of flow regulators (not illustrated) which regulate the flow of the material gas 18 introduced from the gas respective introduction ports 16.

Since the plasma density generated inside the plasma generating chamber 12 is proportional to the density of the material gas 18 inside the plasma generating chamber 12, as described above, the flow rate of the material gas 18 introduced into the respective partitions is regulated, thus making it possible to adjust the plasma density inside the respective partitions. As a result, its possible to control a plasma density distribution in the Y direction inside the plasma generating chamber 12. The plasma density distribution may be controlled in combination with the above control.

In place of the direct heating-type cathode (filament) as described in the above embodiment, the respective cathodes 40 may be an indirectly heated cathode. One example which typically depicts the periphery of one of the cathodes 40 is shown in FIG. 9.

Figure 9:
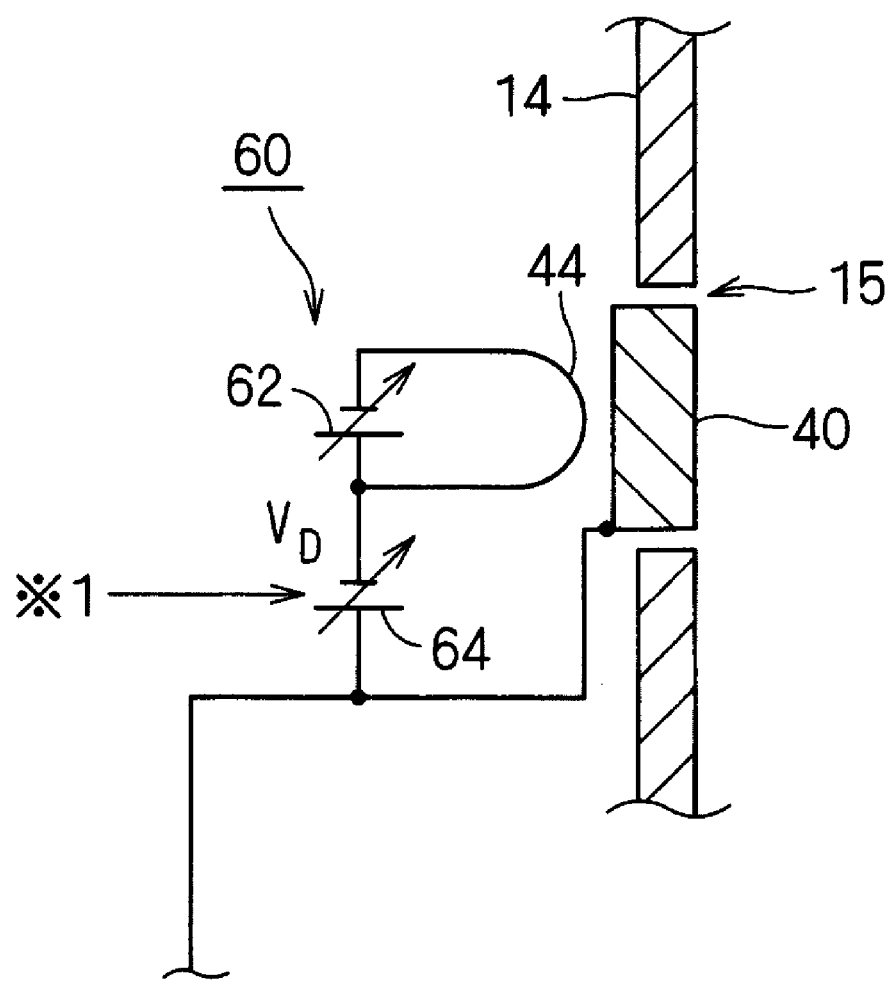
FIG. 9 is a schematic view showing one example of an indirectly heated cathode.

In the example shown in FIG. 9, a cathode 40 is provided at a hole 15 on a rear face plate 14 of the plasma generating chamber 12. Where the rear reflecting electrode 58 is provided, a hole may also be provided thereon. Behind the cathode 40, provided is a filament 44 which heats the cathode 40 to emit electrons (thermal electrons) from the cathode 40 into the plasma generating chamber 12. The filament 44 is connected to a filament power source 62 which heats the filament. The filament power source 62 may be, as illustrated, a direct-current power source or an alternating-current power source.

A direct-current bombard power source 64 is connected between the filament 44 and the cathode 40 with the cathode 40 given to the positive electrode. The direct-current bombard power source 64 accelerates thermal electrons emitted from the filament 44 toward the cathode 40 to heat the cathode 40 through utilization of the collision of these thermal electrons. This bombard power source 64 and the filament power source 62 constitute a cathode power source 60.

At least one of the power sources 62, 64 is increased or decreased in output, thus making it possible to control a quantity of electrons emitted from the cathodes 40. For example, an output voltage $V_D$ of the bombard power source 64 may be controlled (increased/decreased) by a controller 90 to be described later.

A more specific constitution in which the cathodes 40 and the filaments 44 are arranged with respect to the plasma generating chamber 12 is briefly illustrated in FIG. 9. However, a known constitution, for example, disclosed in Japanese Patent No. 3758667 may be adopted.

Further, the cathodes 40 and the filaments 44 may be placed inside the plasma generating chamber 12. For example, where the rear reflecting electrode 58 is provided, as with the cathodes 40 shown in FIG. 2, the cathodes 40 may be placed further inside than the rear reflecting electrode 68.

(2) Ion Implantation Apparatus

Figure 10:
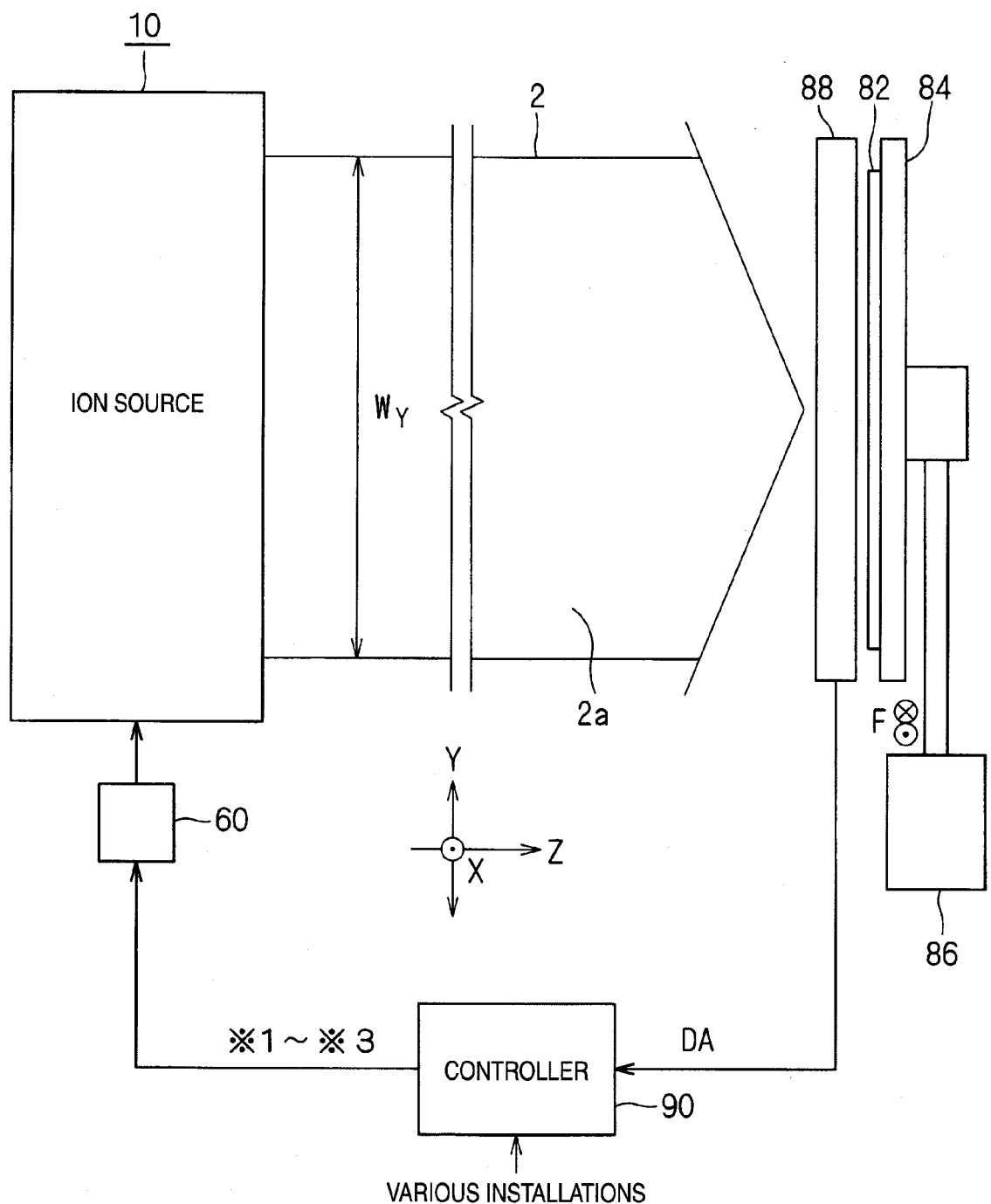
FIG. 10 is a schematic view showing one embodiment of the ion implantation apparatus of the present invention.

FIG. 10 is a schematic diagram showing one embodiment of an ion implantation apparatus equipped with the ion source 10 shown in FIG. 2.

This ion implantation apparatus is an apparatus which makes a ribbon-shaped ion beam 2 extracted from the ion source 10 incident into a target 82 to perform ion implantation and provided with a beam measuring instrument 88, a controller 90 and others described below, in addition to the ion source 10 and the plurality of cathode power sources 60 (however, only one of them is illustrated in FIG. 10).

A transport route of the ion beam 2 from the ion source 10 to the periphery of the target 82 is inside the vacuum chamber (not illustrated) and kept at a vacuum atmosphere. Further, the ion beam 2 may be curved in the X direction during the transport, for example, by a mass analysis magnet or the like. Including this case, in FIG. 10, an advancing direction of the ion beam 2 is always set to the Z direction.

The target 82 is, for example, a semi-conductor substrate and a glass substrate.

The beam measuring instrument 88 is to measure a beam current density distribution of the ion beam 2 in the Y direction inside an implantation chamber (not illustrated) for making the ion beam 2 incident into the target 82. More specifically, the beam measuring instrument 88 is provided in the vicinity of the target 82 to measure the beam current density distribution of the ion beam 2 in the Y direction at a position corresponding to the target 82.

Where the beam measuring instrument 88 is provided, as illustrated, in front of the target 82, on ion implantation to the target 82, the beam measuring instrument 88 may be moved to a place which will not interfere with the ion implantation. Where the beam measuring instrument 88 is provided at the back of the target 82, on measurement, the target 82 or the like may be moved to a place which will not interfere with the measurement.

The beam measuring instrument 88 is a multipoint beam measuring instrument in which, for example, many measuring instruments for measuring a beam current density of the ion beam 2 (for example, a Faraday cup) are installed parallel in the Y direction. However, such a constitution that one measuring instrument is moved by a movement mechanism in the Y direction is also acceptable.

This ion implantation apparatus is provided with a target driving device 86 which moves (for example, reciprocates) a holder 84 which retains a target 82, together with the target 82 in a direction intersecting with a principal plane 2a of the ion beam 2 in the X direction, for example, as shown by the arrow F.

A dimension $W_Y$ of the ion beam 2 in the Y direction is made greater than a dimension in the Y direction of the target 82 and the target driving device 86 is used to move a target 82, the above-described methods are both used, thus making it possible to perform ion implantation on the whole surface of the target 82.

The controller 90 has a function which controls the respective cathode power sources 60 (for details, refer to FIG. 2 and FIG. 9) on the basis of measurement information DA from the beam measuring instrument 88 and controls a quantity of electrons emitted from the respective cathodes 40, thereby making a beam current density distribution measured by the beam measuring instrument 88 closer to a predetermined distribution. Thereby, it is possible to make the beam current density distribution of the ribbon-shaped ion beam 2 in the Y direction inside the implantation chamber closer to a predetermined distribution.

Giving a more specific example of the control functions performed by the controller 90, the controller 90 has a control function to perform at least one of the actions for decreasing a quantity of electrons emitted from the cathode 40 corresponding to a domain relatively great in beam current density measured by the beam measuring instrument 88 and increasing a quantity of electrons emitted from the cathode 40 corresponding to a domain relatively small in beam current density, thereby making the beam current density distribution measured by the beam measuring instrument 88 close to uniform. Therefore, in this case, it is possible to improve the uniformity of a beam current density distribution of the ribbon-shaped ion beam 2 in the Y direction inside the implantation chamber.

Figure 11:
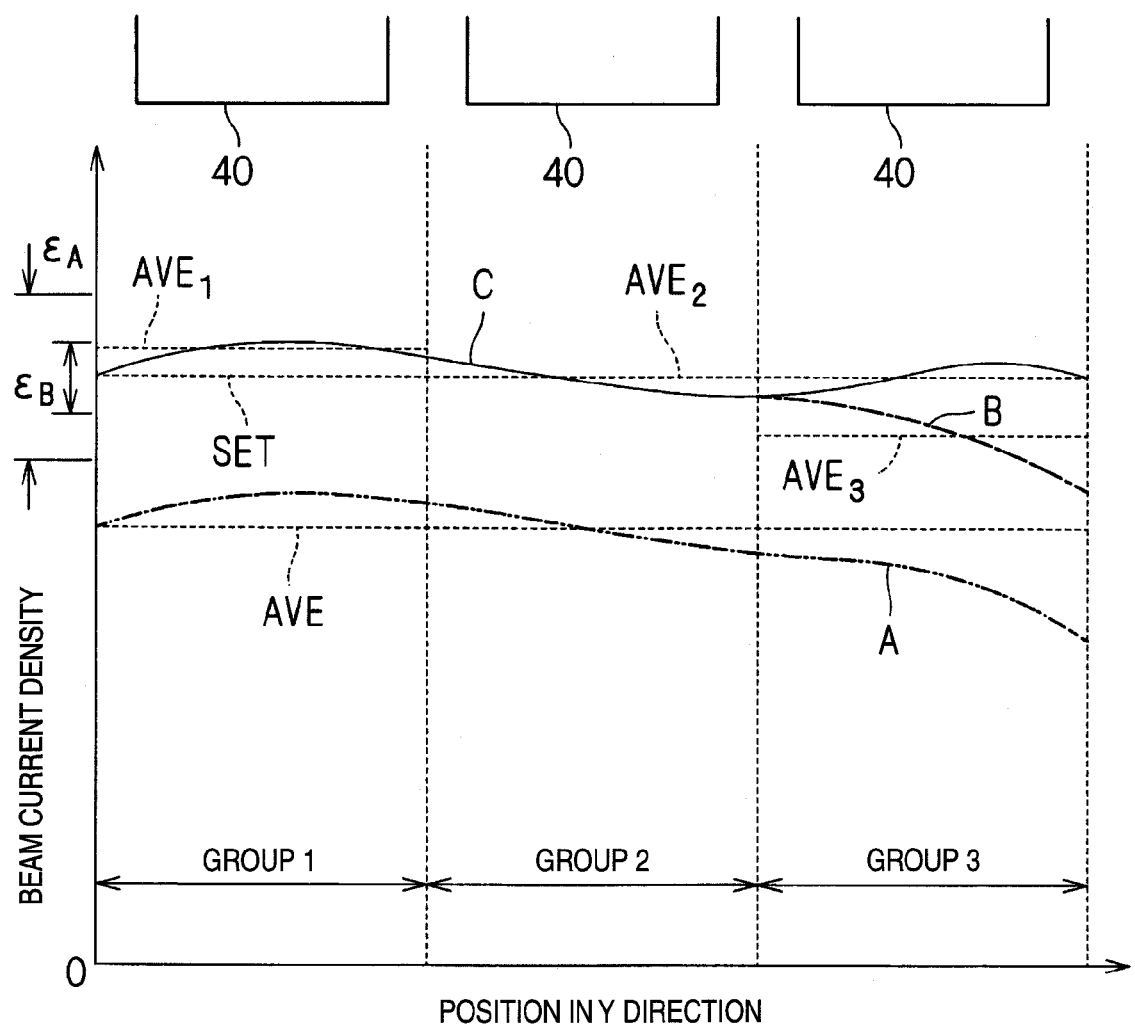
FIG. 11 is a schematic view showing one example of a beam current density distribution around the control of uniformity.
Figure 12:
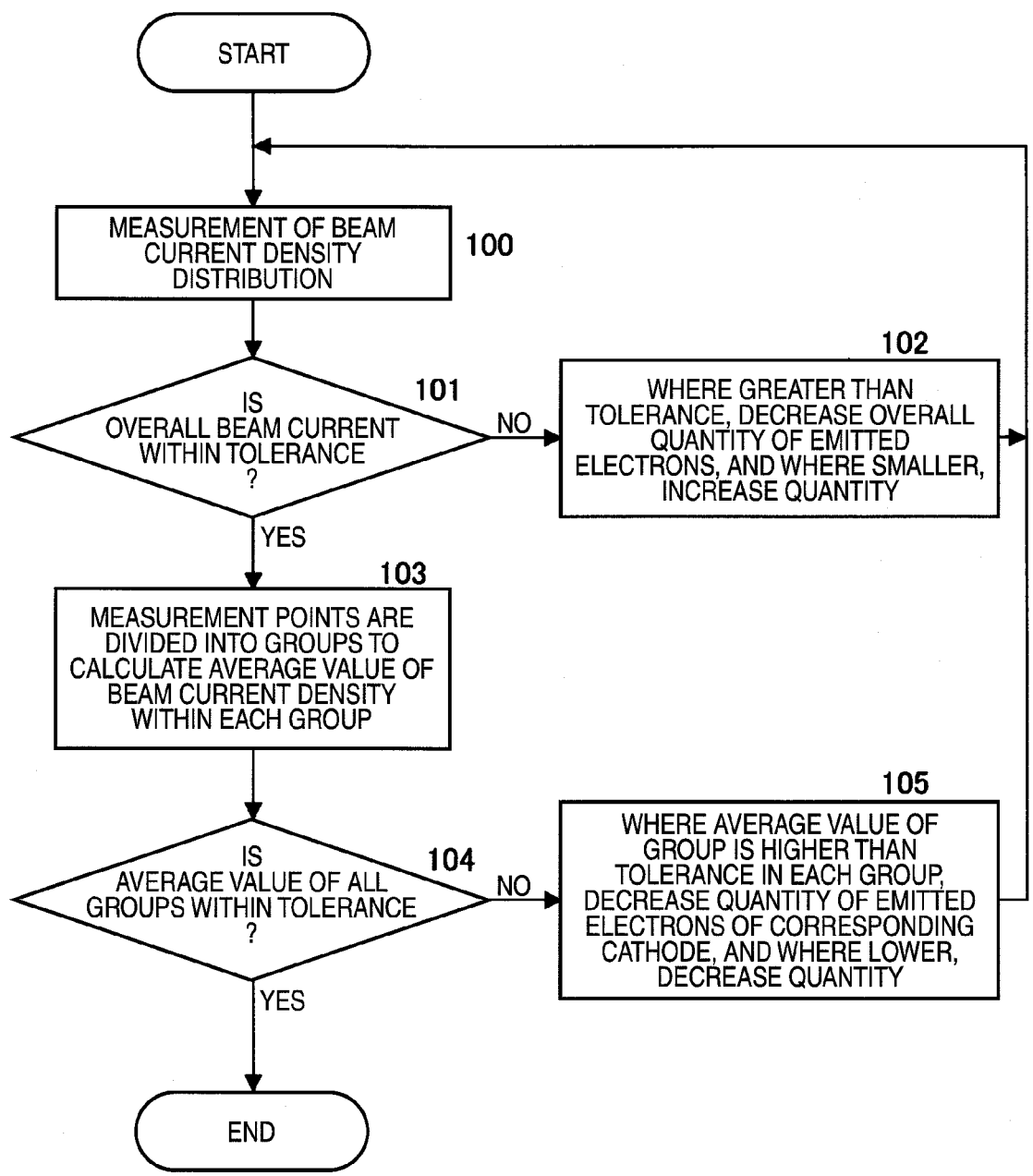
FIG. 12 is a flow chart showing one example of the control details where the beam current density distribution is made uniform.

A description will be given of a more specific example of the control details which improve the uniformity of the beam current density distribution of the ion beam 2 in the Y direction with reference to FIG. 12. A brief example of the beam current density distribution before and after the control of uniformity is shown in FIG. 11. Hereinafter, FIG. 11 will also be referred. It is noted that the following set value SET and tolerances $\epsilon_A$, $\epsilon_B$, may be set in advance, for example, in the controller 90.

Next, the beam measuring instrument 88 is used to measure an overall beam current density distribution of the ion beam 2 in the Y direction (Step 100). Thereby, a beam current density distribution A, for example, in FIG. 11 is obtained.

Then, a determination is made for whether an overall beam current of the ion beam 2 having the above-described beam current density distribution A is within a predetermined tolerance (Step 101). The overall beam current of the ion beam 2 is divided by a length of the ion beam 2 in the Y direction to obtain an average value AVE of the beam current density distribution A. Therefore, a determination of the overall beam current of the ion beam 2 and that of the average value AVE are substantially the same and the above-described average value AVE may be a target to be determined in Step 101 and Step 102.

Where the overall beam current of the ion beam 2 is not within a tolerance, processing proceeds to Step 102. Where the beam current is greater than the tolerance, a quantity of electrons emitted from all the cathodes 40 is uniformly made small, and where it is smaller, a quantity of electrons emitted from all the cathodes 40 is made uniformly great. This description of "uniformly" means to increase or decrease a quantity of electrons with each other substantially only by the same quantity with respect to the plurality of cathodes 40.

The quantity of the thus emitted electrons is increased or decreased, by which a plasma density inside the plasma generating chamber 12 is increased or decreased, and accordingly the beam current of the ion beam 2 is increased or decreased. Thereafter, the processing returns to Step 100 and the control of Step 100 to Step 102 will be repeated until the overall beam current of the ion beam 2 falls within the tolerance.

Due to the above control, the overall beam current of the ion beam 2 is controlled so as to fall within the tolerance. In terms of an average value AVE, this value is controlled so as to fall within the tolerance $\epsilon_A$. Thereby, for example, a beam current density distribution B shown in FIG. 11 is obtained. In this state, no individual adjustment is made yet, and the beam current density distribution B is similar in configuration to the original beam current density distribution A, or such a configuration that the beam current density distribution A is substantially subjected to parallel displacement.

In Step 101, where the overall beam current of the ion beam 2 is determined to fall within a tolerance, the processing proceeds to Step 103. In Step 103, a domain determined by the beam measuring instrument 88 is divided into groups based on each range corresponding to the respective cathodes 40 in the Y direction, thereby calculating an average value of the beam current density in the respective groups. For example, where cathodes 40 are arranged in three stages in the Y direction, as shown in FIG. 11, they are divided into Group 1 to Group 3, thereby calculating average values $AVE_1$ to $AVE_3$. In other words, the above division into groups is to divide the cathodes 40 in the respective stages into groups based on each plasma density in the Y direction or each range which influences the beam current density. This division into groups is meaningful because, as described above, the ion source 10 is able to partially control the beam current density in the Y direction.

Then, the processing proceeds to Step 104, and a determination is made for whether average values of all the groups are within a predetermined tolerance $\epsilon_B$. In most cases, as shown in FIG. 11, a relationship of $\epsilon_A > \epsilon_B$ is kept. Where averages of all the groups are within the tolerance $\epsilon_B$, the control is terminated. In the example of FIG. 11, average values $AVE_1$ and $AVE_2$ of Group 1 and Group 2 are within the tolerance $\epsilon_B$ while an average value $AVE_3$ of Group 3 is lower than the tolerance $\epsilon_B$.

Where a group, the average value of which is not within the tolerance $\epsilon_B$ exists, the processing proceeds to Step 105. Here, the cathode power sources 60 are individually controlled, thereby controlling a quantity of electrons emitted from the respective cathodes 40. Specifically, where an average value of the group is higher than the tolerance $\epsilon_B$, a quantity of electrons emitted from the cathode 40 corresponding to the group is decreased. Where the average value is lower (for example, refer to the average value $AVE_3$ in FIG. 11), the control to increase the quantity of the thus emitted electrons is performed. The quantity of the thus emitted electrons is increased or decreased, by which, as described above, a plasma density at a region corresponding to the respective cathodes 40 is increased or decreased and accordingly, a beam current density of the group corresponding to the domain is increased or decreased.

Thereafter, the processing returns to Step 100, and the above-described control is repeated. Thereby, the control is performed so that the overall beam current of the ion beam 2 falls within a tolerance and an average value of the beam current density in each group also falls within the tolerance. As a result, for example, a beam current density distribution C shown in FIG. 11 is obtained. Specifically, the beam current density distribution of the ion beam 2 in the Y direction is made close to uniform, thus making it possible to improve the uniformity of the beam current density distribution.

To adjust the overall beam current in Step 102, the control of an output voltage $V_A$ of the above-described arc power source 66 and the control of increasing or decreasing the plasma density inside a plasma generating chamber 12 are both used.

Further, the arc power source 66 is provided separately on the respective cathodes 40, and in Step 105 in place of controlling the respective cathode power sources 60 or in combination with the control, the output voltage $V_A$ of the respective arc power sources 66 may be controlled so as to increase or decrease a beam current density of each group.

Still further, as described with reference to FIG. 7, where a material gas 18 is independently introduced into partitions divided by the partitioning plates 80, the control of plasma density for each partition by flow rate control of the material gas 18 may also be used for rough adjustment of the plasma density distribution.

What is claimed is:

1. An ion source which extracts, in a Z direction, a ribbon-shaped ion beam having a dimension in a Y direction greater than that in a X direction wherein the X direction, the Y direction and the Z direction are substantially orthogonal at one point, the ion source comprising:
    a plasma generating chamber into which a material gas is introduced to generate plasma thereinside;
    a plasma electrode which is disposed near the end of the plasma generating chamber in the Z direction and has an ion extracting port extending in the Y direction;
    a plurality of cathodes which emits electrons into the plasma generating chamber to cause an electrical discharge inside the plasma generating chamber to ionize the material gas, thereby generating the plasma, the cathodes being disposed inside the plasma generating chamber on the side opposite to the plasma electrode, the cathodes being arranged in a plurality of stages along the Y direction; and
    a magnetic coil which is disposed outside the plasma generating chamber to generate magnetic fields along the Z direction inside the plasma generating chamber and also at a domain containing the plurality of cathodes.

2. The ion source according to claim 1, wherein
    the plasma electrode is rendered to a negative potential more greatly than each of the cathodes, thereby acting as a reflecting electrode which reflects electrons inside the plasma generating chamber.

3. The ion source according to claim 2, further comprising:
a rear reflecting electrode disposed behind the plurality of cathodes inside the plasma generating chamber which is rendered to a negative potential more greatly than cathodes to reflect electrons.

4. The ion source according to claim 1, wherein
the magnetic coil includes a plurality of coils, which are wound so as to enclose the plasma generating chamber, with the Z direction given as an axis and generate magnetic fields which face each other in the same direction, the coils being disposed so as to be spaced away from each other along the Z direction.

5. The ion source according to claim 4, wherein
magnetic fields generated by a coil disposed on the side closest to the plasma electrode, among the plurality of coils, are made stronger than magnetic fields generated by other coils.

6. An ion implantation apparatus comprising:
the ion source according to claim 1;
a plurality of cathode power sources which heats each cathode of the ion source to emit electrons;
an implantation chamber which makes the ion beam generated from the ion source incident into a target;
a beam measuring instrument which measures a beam current density distribution of the ion beam in the Y direction inside the implantation chamber; and
a controller which is formed to control the cathode power sources on the basis of measurement information from the beam measuring instrument and also control a quantity of electrons emitted from each of the cathodes, so that the beam current density distribution measured by the beam measuring instrument is made closer to a predetermined distribution.

7. The ion implantation apparatus according to claim 6, wherein
the controller performs at least one of the actions for decreasing a quantity of electrons emitted from the cathode corresponding to a domain relatively great in beam current density measured by the beam measuring instrument and increasing a quantity of electrons emitted from the cathode corresponding to a domain relatively small in beam current density, thereby making the beam current density distribution measured by the beam measuring instrument close to uniform.

* * * * *